(12) United States Patent
Lung et al.

(10) Patent No.: US 8,093,661 B2
(45) Date of Patent: *Jan. 10, 2012

(54) INTEGRATED CIRCUIT DEVICE WITH SINGLE CRYSTAL SILICON ON SILICIDE AND MANUFACTURING METHOD

(75) Inventors: Hsiang-Lan Lung, Elmsford, NY (US); Erh-Kun Lai, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 380 days.

This patent is subject to a terminal disclaimer.

(21) Appl. No.: 12/349,903

(22) Filed: Jan. 7, 2009

(65) Prior Publication Data

US 2010/0171188 A1    Jul. 8, 2010

(51) Int. Cl.
*H01L 29/86* (2006.01)
*H01L 21/334* (2006.01)

(52) U.S. Cl. ........... 257/384; 257/754; 257/E27.07; 438/655

(58) Field of Classification Search ............ 257/769
See application file for complete search history.

(56) References Cited

U.S. PATENT DOCUMENTS

| | | | |
|---|---|---|---|
| 4,554,045 A * | 11/1985 | Bean et al. | 117/105 |
| 5,166,758 A | 11/1992 | Ovshinsky et al. | |
| 5,236,872 A | 8/1993 | van Ommen et al. | |
| 5,789,758 A | 8/1998 | Reinberg | |
| 6,011,272 A | 1/2000 | Omid-Zohoor et al. | |
| 6,586,761 B2 | 7/2003 | Lowrey | |
| 6,649,976 B2 | 11/2003 | Iwamatsu et al. | |
| 6,653,733 B1 | 11/2003 | Gonzalez et al. | |
| 6,737,675 B2 | 5/2004 | Patel et al. | |
| 6,815,298 B2 | 11/2004 | Tsuchiaki | |
| 6,888,750 B2 | 5/2005 | Walker et al. | |
| 7,085,154 B2 | 8/2006 | Cho et al. | |
| 7,129,538 B2 | 10/2006 | Lee et al. | |

(Continued)

FOREIGN PATENT DOCUMENTS

EP    0494598    7/1992

OTHER PUBLICATIONS

Horii, H. et al., "A Novel Cell Technology Using N-doped GeSbTe Films for Phase Change RAM," 2003 Symposium on VLSI Technology Digest of Technical Papers, pp. 177-178.

(Continued)

*Primary Examiner* — Stephen W Smoot
(74) *Attorney, Agent, or Firm* — Haynes Beffel & Wolfeld LLP

(57) ABSTRACT

A silicide element separates a single crystal silicon node from an underlying silicon substrate, and is capable of acting as a conductive element for interconnecting devices on the device. The single crystal silicon node can act as one terminal of a diode, and a second semiconductor node on top of it can act as the other terminal of the diode. The single crystal silicon node can act as one of the terminals of the transistor, and second and third semiconductor nodes are formed in series on top of it, providing a vertical transistor structure, which can be configured as a field effect transistor or bipolar junction transistor. The silicide element can be formed by a process that consumes a base of a protruding single crystal element by silicide formation processes, while shielding upper portions of the protruding element from the silicide formation process.

16 Claims, 10 Drawing Sheets

U.S. PATENT DOCUMENTS

| | | | |
|---|---|---|---|
| 7,190,607 | B2 | 3/2007 | Cho et al. |
| 7,230,286 | B2 * | 6/2007 | Cohen et al. ............... 257/210 |
| 7,365,385 | B2 | 4/2008 | Abbott |
| 7,505,330 | B2 | 3/2009 | Pawlowski et al. |
| 2006/0034112 | A1 | 2/2006 | Oh et al. |
| 2006/0081843 | A1 * | 4/2006 | Bromberger ................ 257/49 |
| 2007/0140029 | A1 | 6/2007 | Kim et al. |
| 2009/0273968 | A1 | 11/2009 | Lamorey et al. |

OTHER PUBLICATIONS

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Lai, Stephan et al., "OUM-A 180 nm Nonvolatile Memory Cell Element Technology for Stand Alone and Embedded Applications," IEEE IEDM 2001, pp. 803-806.

Oh, J.H., et al., *Full Integration of Highly Manufacturable 512Mb PRAM based on 90nm Technology*, International Electron Devices Meeting, IEDM '06, Dec. 11-13, 2006 pp. 1-4.

Pellizer, F., et al., *A 90nm Phase Change Memory Technology for Stand-Alone non-Volatile Memory Applications*, 2006 Symp. on VLSI Technology Digest of Technical Papers, 2 pages.

Risch, Lothar, et al., *Recent Progress With Vertical Transistors*, Proc. of the 27th EP Solid-State Device Research Conference, Sep. 22-24, 1997, pp. 34-41.

\* cited by examiner

Fig. 3A
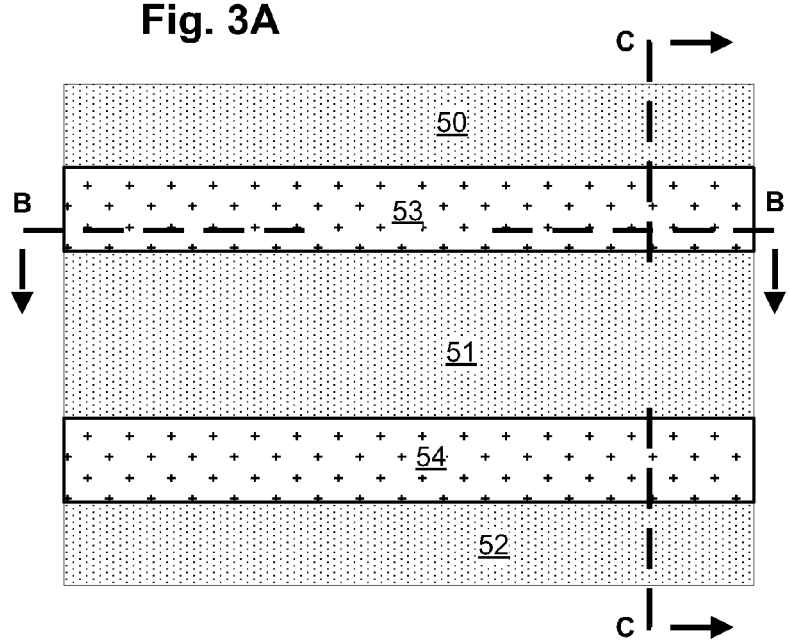
Fig. 3C
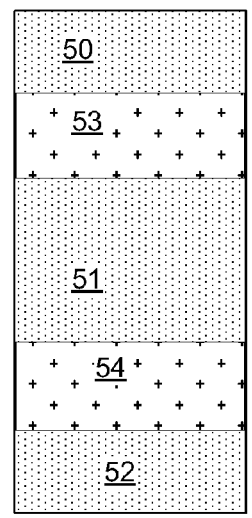
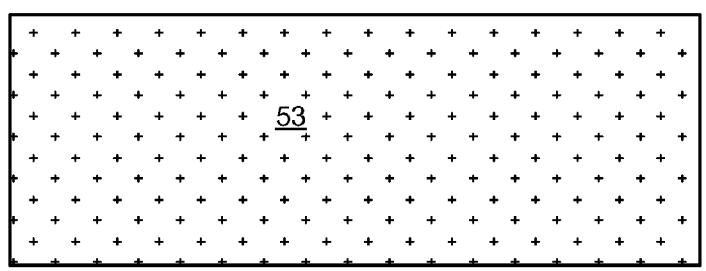
Fig. 3B

Fig. 5A
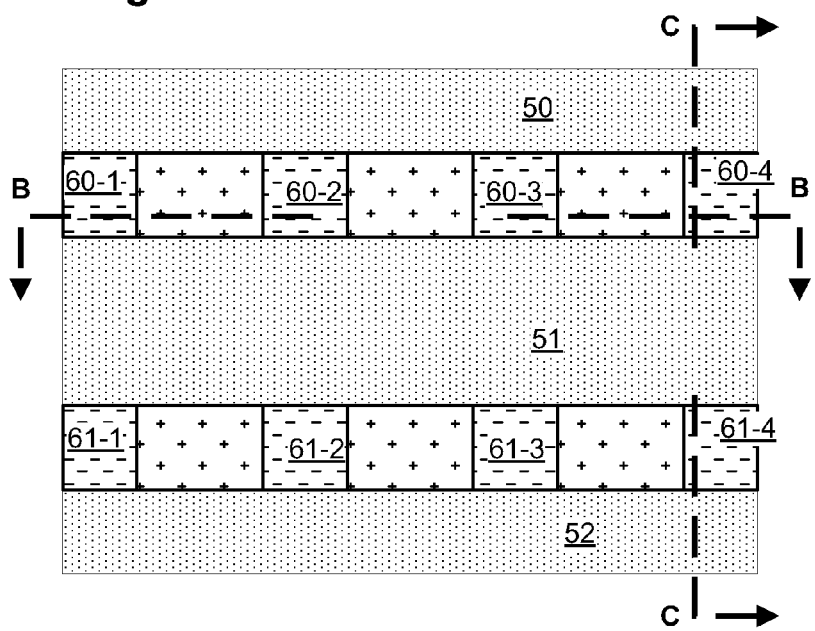
Fig. 5C
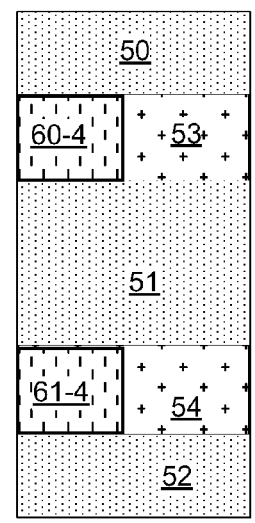
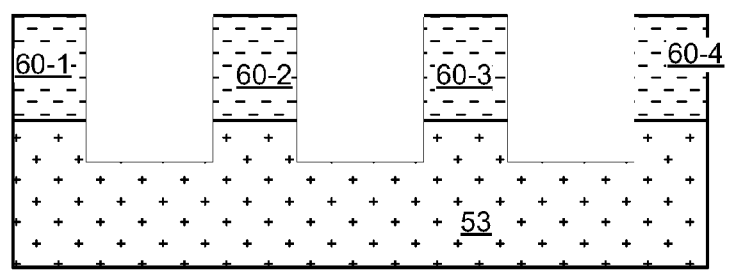
Fig. 5B

Fig. 6A
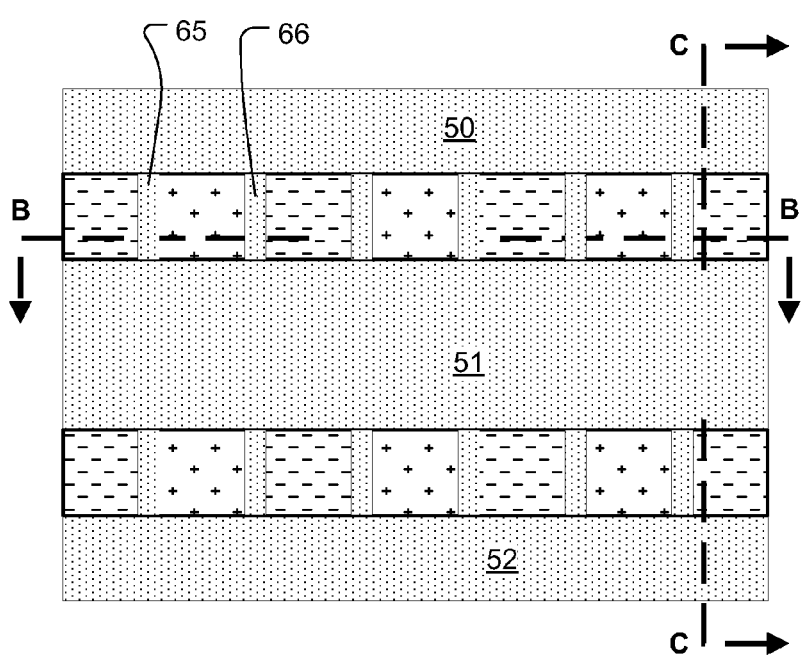
Fig. 6C
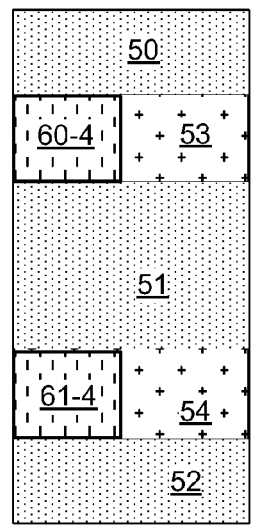
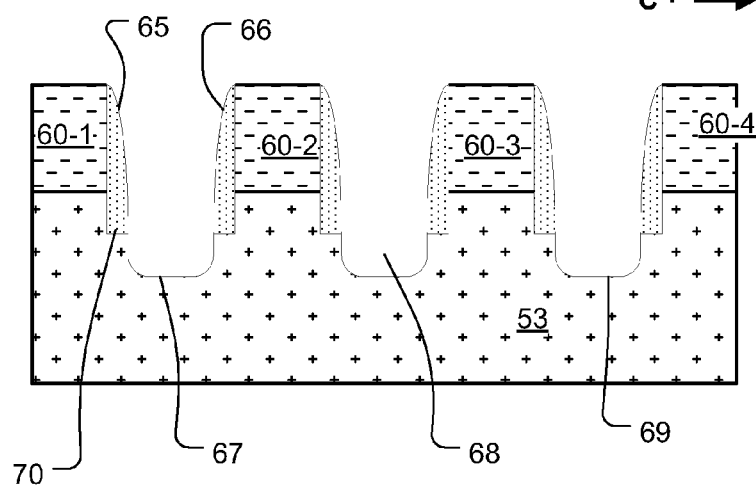
Fig. 6B

Fig. 8A
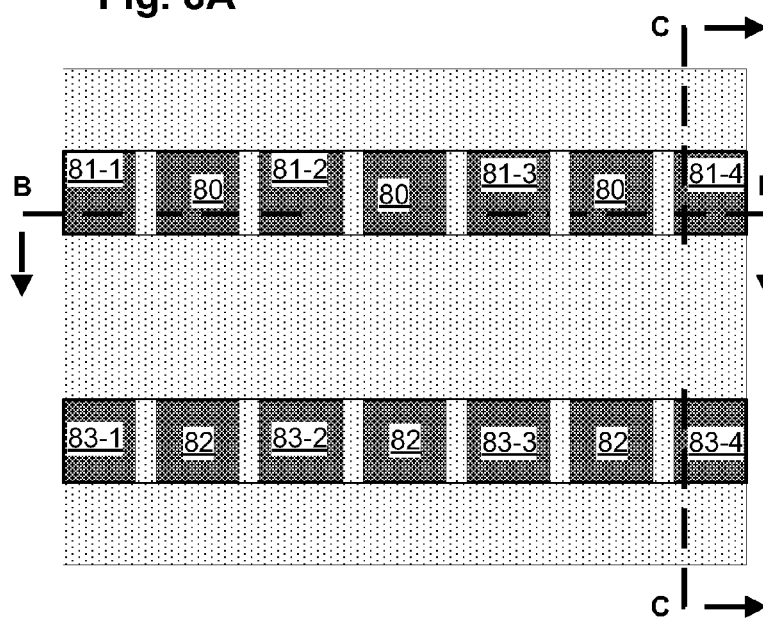
Fig. 8C
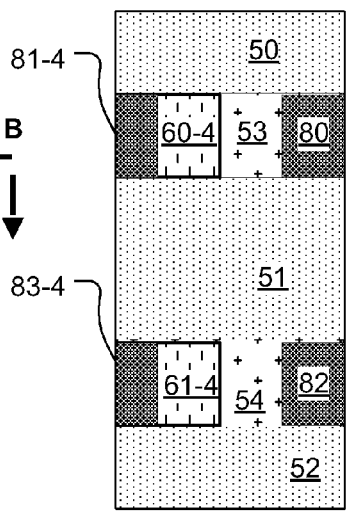
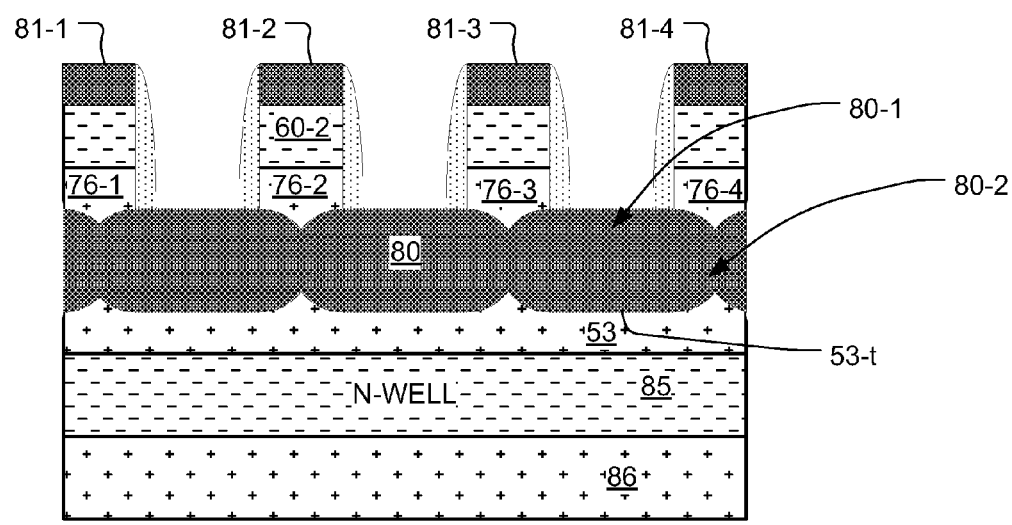
Fig. 8B

Fig. 10A
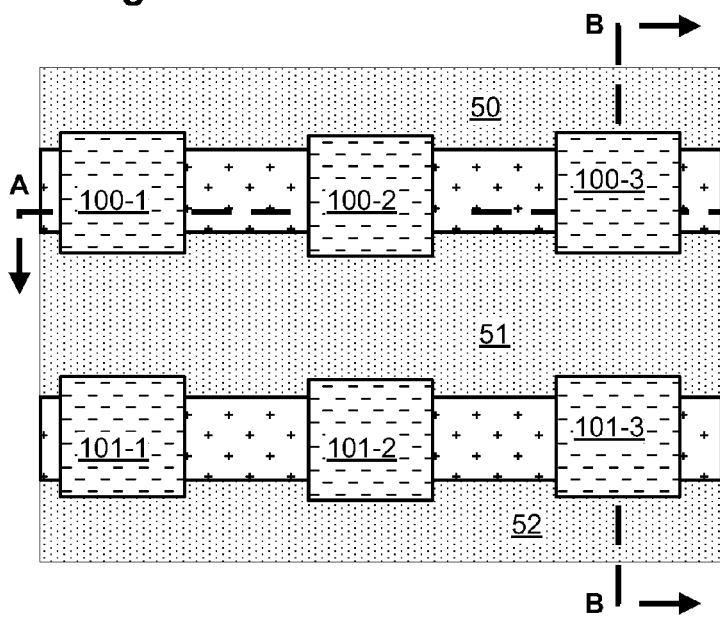
Fig. 10C
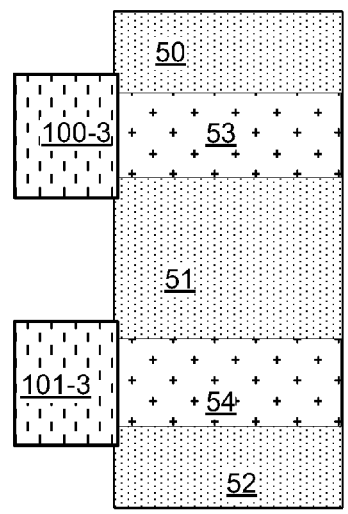
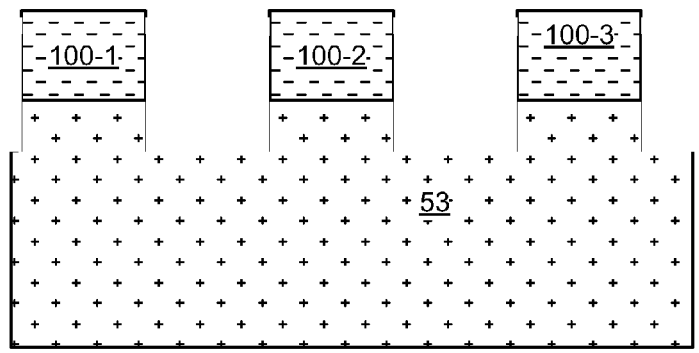
Fig. 10B

INTEGRATED CIRCUIT DEVICE WITH SINGLE CRYSTAL SILICON ON SILICIDE AND MANUFACTURING METHOD

BACKGROUND

1. Field of the Invention

The present invention relates to integrated circuit devices including buried silicide conductors, and to methods for manufacturing such devices.

2. Description of Related Art

One common technology for interconnecting components on integrated circuits requires the use of buried diffusion lines, which consist of lines of implanted dopants in relatively high concentration, so that they act as conductors in the substrate. A problem that arises with the use of buried diffusion lines or other doped semiconductor features is the formation of parasitic devices. Semiconductor regions that are adjacent the buried diffusion lines can produce carriers during operation. These carriers can migrate into the buried diffusion lines, and activate parasitic devices causing breakdown or current leakage.

Silicides are commonly used in integrated circuit manufacturing to increase the conductivity of doped silicon lines or elements. A common version of the material is referred to as a "salicide", changing the first two letters of the word to "sa-", in a reference to self-aligned techniques for forming the material on the chip. A self-aligned process for forming silicide involves depositing a silicide precursor over a substrate that includes exposed regions of silicon, and annealing the silicide precursor to form a silicide in the exposed regions. Then the remaining silicide precursor on the substrate is removed leaving the self-aligned silicide elements. Typical silicide precursors include metals or combinations of metals such as cobalt, titanium, nickel, molybdenum, tungsten, tantalum, and platinum. Also, silicide precursors may include metal nitrides or other metal compounds. Representative uses of silicides in integrated circuit manufacturing are shown in U.S. Pat. Nos. 7,365,385; 7,129,538; 6,815,298; 6,737,675; 6,653,733; 6,649,976 and 6,011,272; and in U.S. Patent Application Publication No. US 2001/0055838.

One limitation on the utilization of silicides arises because there is no practical technique for providing a single crystal silicon node on top of a silicide, or for providing a silicide between two single crystal nodes of silicon, without intervening layers of material. (Compare for example, European Patent Application Publication No. 0 494 598 A1). When forming a silicon element on top of a silicide, only amorphous or polycrystalline silicon have been made in prior art technologies. Thus, certain types of devices in which it is preferable to utilize single crystal silicon cannot be formed on top of a silicide contact. This limitation arises in the formation of vertical access devices such as diodes and transistors in memory arrays, and in other vertical device structures.

It is desirable therefore to provide a technology for implementing a single crystal silicon node on top of a conductive element which can be used as a replacement for buried diffusion conductors.

SUMMARY

A device is described that comprises a silicide element on a silicon substrate with a single crystal silicon node on the silicide element. The silicide element separates the single crystal silicon node from the underlying silicon substrate, preventing the flow of carriers from the single crystal silicon node into the substrate, and is capable of acting as a conductive element for interconnecting devices on the device. In some embodiments, the single crystal silicon node acts as one terminal of a diode, and a second semiconductor node is formed on top of it, acting as the other terminal of the diode. In other embodiments, the single crystal silicon node acts as one of the terminals of the transistor, and a second semiconductor node and an additional semiconductor node are formed in series on top of it, providing a vertical transistor structure. Such a transistor structure can be configured as a field effect transistor or bipolar junction transistor, as suits a particular application of the technology.

Also, an integrated circuit device is described that comprises a single crystal silicon body having a top surface, and a plurality of protruding elements that consist of single crystal silicon features protruding from the top surface of the body. A silicide conductor has first portions on the top surface of the body between the protruding elements, and second portions abutting the first portions so as to form a continuous conductor, which extends through the protruding elements. The silicide conductor then separates remaining portions of the protruding elements, which consist of single crystal silicon features, from the underlying single crystal silicon body.

A manufacturing method is described that includes providing a single crystal silicon body, and forming a protruding element on the single crystal silicon body. A silicide precursor is deposited on the single crystal silicon body adjacent the protruding element. The structure is annealed to induce formation of silicide by reaction of the silicide precursor with the single crystal silicon body. The silicide formation consumes the silicon of the single crystal silicon body until the silicide forms a conductor separating the remaining portion of the protruding element from an underlying portion of the single crystal silicon body. As a result, a single crystal silicon node is formed on top of the underlying silicide, and is separated from the underlying single crystal silicon body on the silicide.

In an embodiment of the manufacturing method described herein, a sidewall blocking layer is formed on the sides of the protruding element, and an etching step is executed, which etches into the single crystal silicon body using the sidewall blocking layer as a mask to expose a portion of the single crystal silicon body beneath the sidewall blocking layer. The portions of the single crystal silicon body beneath the sidewall blocking layer are consumed by the silicide formation, while the blocking layer protects the upper portions of the protruding element from silicide formation. Thereby, the upper portion of the protruding element remains in a single crystal state, and becomes separated from the underlying single crystal silicon body by the silicide formed beneath it. The silicide made using this process is integral with the underlying silicon body and the overlying silicon node, in the sense that the formation silicide by consuming the silicon integrates the silicide within the protruding elements. This integral nature of the silicide provides a silicon/silicide interface with excellent electrical and structural characteristics.

A process for forming a pn-junction on the single crystal silicon node includes implanting dopants having a conductivity type opposite that of the single crystal silicon node into the upper surface of the single crystal silicon node. As result, a second single crystal silicon node is formed in contact with the first single crystal silicon node with a pn-junction therebetween within the protruding element. In an alternative process for forming a pn-junction on the single crystal silicon node, a second semiconductor node can be deposited and patterned on top of the protruding element. The second semiconductor node will have a conductivity type opposite that of the single crystal silicon node, and establish a pn-junction therebetween.

A process for forming a transistor that includes the single crystal silicon node comprises first forming a pn-junction as described above, followed by formation of a additional semiconductor node having the same conductivity type as that of the single crystal silicon node. The second semiconductor node of the pn-junction can be configured to act as a base of a bipolar junction transistor, or as a channel of a field effect transistor.

Other aspects and advantages of the technology described herein can be seen with reference to the figures, the detailed description and the claims which follow.

BRIEF DESCRIPTION OF THE DRAWINGS

FIGS. 3A-3C are a plan view, a horizontal cross-section view and a vertical cross-section view, respectively, of a work piece during a stage after making isolation structures and elongated silicon structures of a first representative process for making an integrated circuit component having a single crystal silicon node on top of a silicide element.

FIGS. 5A-5C are a plan view, a horizontal cross-section view and a vertical cross-section view, respectively, of a work piece during a next stage after etching to form protruding elements on the elongated silicon structures in the first representative process.

FIGS. 6A-6C are a plan view, a horizontal cross-section view and a vertical cross-section view, respectively, of a work piece during a next stage after sidewall formation and deeper etching between the sidewalls into the elongated silicon structures in the first representative process.

FIGS. 8A-8C are a plan view, a horizontal cross-section view and a vertical cross-section view, respectively, of a work piece during a next stage after annealing to form silicide and cleaning of excess precursor material in the first representative process.

FIGS. 10A-10C are a plan view, a horizontal cross-section view and a vertical cross-section view, respectively, of a work piece during an alternative to the implant step of FIGS. 4A-4C where polysilicon nodes are deposited over the protruding elements on the elongated silicon structures.

DETAILED DESCRIPTION

Figure 1:
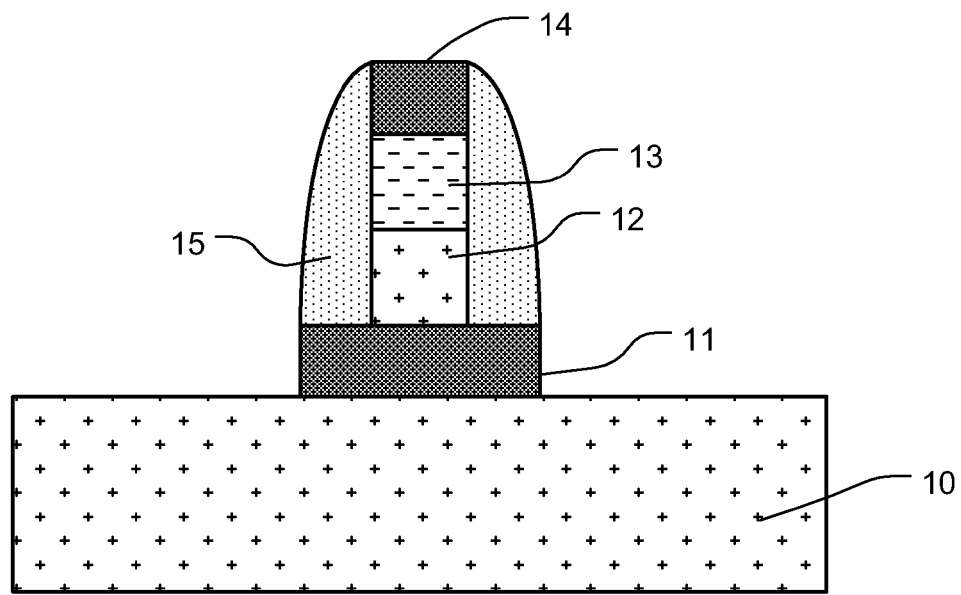
FIG. 1 is a simplified drawing of an integrated circuit component having a single crystal silicon node on top of a silicide element.

FIG. 1 illustrates an integrated circuit device formed on a single crystal silicon body 10, such as an epitaxial silicon layer in a silicon-on-insulator structure or a bulk silicon substrate. The device includes a silicide element 11, on top of which is a single crystal silicon node 12. A second semiconductor node 13 having a conductivity type opposite that of the single crystal silicon node 12 contacts the single crystal silicon node 12 forming a pn-junction therebetween. In the illustrated structure, a silicide cap 14 is formed on a second semiconductor node 13. Sidewall structures 15 isolate the pn-junction device from surrounding structures not shown. In the example of FIG. 1, a diode is shown using a single crystal silicon node 12 as one of the anode and cathode of the device. The single crystal silicon node 12 can be utilized in a variety of other structures as well, including transistors, and as a substrate on which additional layers can be formed which benefit from the single crystal nature of the node 12. Likewise, the node shown in cross-section in FIG. 1, can be elongated in a fence-type shape, or configured as a pillar.

Figure 2:
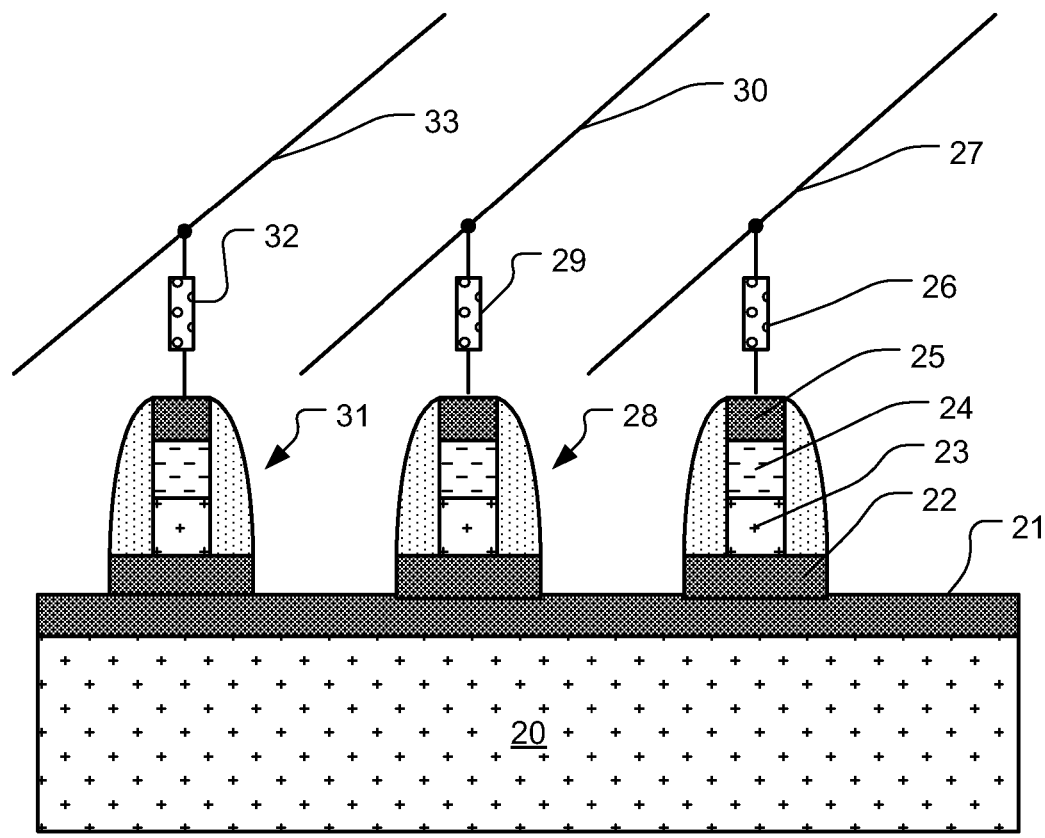
FIG. 2 illustrates an array of drivers for memory elements including diodes having single crystal silicon nodes on top of silicide conductors.

FIG. 2 illustrates one example application of a single crystal silicon node on a silicide element. Specifically, FIG. 2 shows an arrangement of diodes implemented as shown in FIG. 1, used as drivers for memory elements and in a memory array. Thus, a semiconductor body 20 has a silicide conductor 21 on its surface. A silicide element 22 underlies a single crystal silicon node 23 having for example a p-type conductivity. A second silicon node 24 overlies the single crystal silicon node 23, and has the opposite conductivity, for example an n-type conductivity. A silicide cap 25 provides a contact to the diode. A memory element 26 is arranged between the silicide cap 25 and an overlying access line 27. Similar diode 28 is coupled to the silicide conductor 21, and acts as a driver for the memory element 29 which is arranged between the diode 28 and the access line 30. Likewise, a similar diode 31 acts as a driver for the memory element 32, which is arranged between the diode 31 and the access line 33.

FIGS. 3A-3C are a plan view, a horizontal cross-section view and a vertical cross-section view, respectively, of a work piece during a stage after making isolation structures 50, 51, 52 and elongated silicon structures 53, 54 of a first representative process for making an integrated circuit component having a single crystal silicon node on top of a silicide element. The isolation structures 50, 51, 52 can comprise a silicon dioxide, other insulating material or combinations of materials. The isolation structures 50, 51, 52 and elongated silicon structures 53, 54, can be implemented for example, using shallow trench isolation technology or using patterning technology used in silicon-on-insulator SOI processes. In this example, each of the elongated silicon structures 53, 54 can be considered a single crystal silicon substrate, as seen in the cross-section along element 53 in FIG. 3B. FIG. 3C shows elongated silicon structures 53 and 54 completely separated from one another. In other embodiments, elongated silicon structures 53 and 54 may be coupled to a silicon body (not shown) below the isolation structures 50, 51, 52.

Figure 4A:
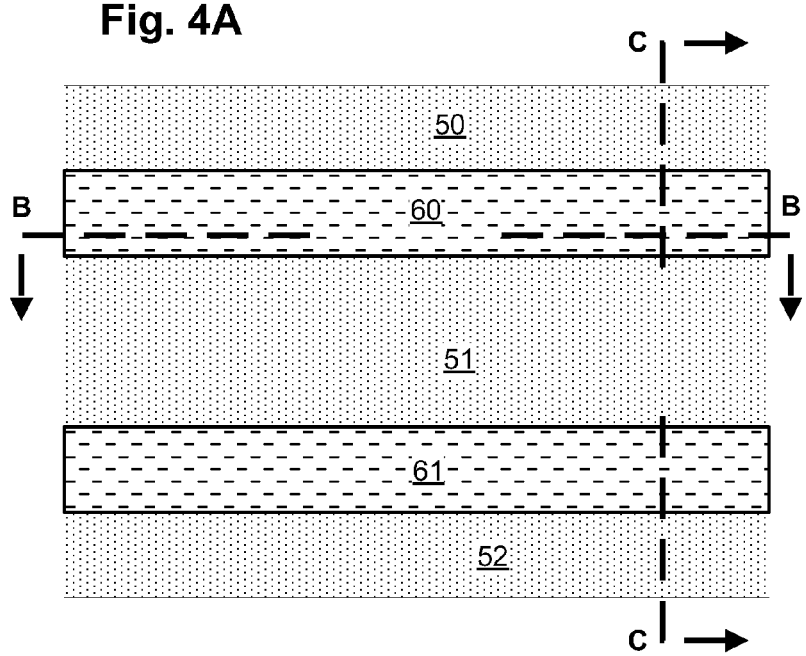
FIGS. 4A-4C are a plan view, a horizontal cross-section view and a vertical cross-section view, respectively, of a work piece during a next stage after doping implants in the elongated silicon structures in the first representative process.
Figure 4C:
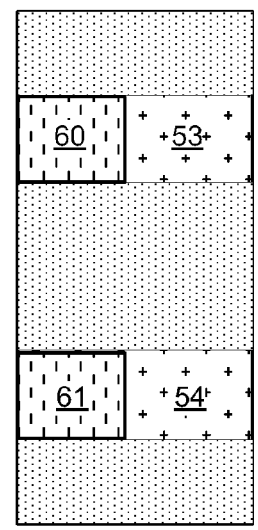
Figure 4B:
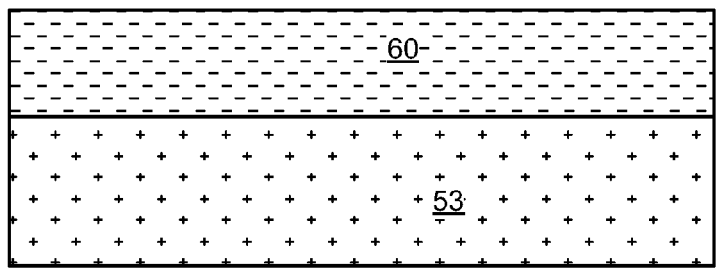

FIGS. 4A-4C are a plan view, a horizontal cross-section view and a vertical cross-section view, respectively, of a work piece during a next stage after doping implants in the elongated silicon structures 53 and 54 in the first representative process, to form second silicon nodes 60, 61 of a conductivity type opposite to that of the elongated silicon structures 53, 54 in doped regions near the surfaces of the structures. For example, if the elongated silicon structures 53, 54 have a p-type conductivity with a concentration sufficient to form an anode of a diode structure, the second silicon nodes 60, 61 are implanted with an n-type dopant with an energy and concentration sufficient to form a cathode of a diode structure.

FIGS. 5A-5C are a plan view, a horizontal cross-section view and a vertical cross-section view, respectively, of a work piece during a next stage after etching to form protruding elements 60-1 through 60-4 and 61-1 through 61-4 on the elongated silicon structures 53, 54 in the first representative process. The protruding elements 60-1 through 60-4 and 61-1 through 61-4 can be formed by defining a pattern of stripes orthogonal to the elongated elements 53 and 54, and applying a selected etch to form rows (along the elongated structures 53, 54) and columns (orthogonal to the elongated structures 53, 54) of protruding elements separated by trenches which do not completely cut through the elongated structures 53, 54, but are deep enough to separate the second of silicon nodes 60-1 through 60-4, as illustrated in FIG. 5B.

FIGS. 6A-6C are a plan view, a horizontal cross-section view and a vertical cross-section view, respectively, of a work piece during a next stage after formation of sidewall blocking layers (e.g. 65, 66) and deeper etching between the sidewall blocking layers into the elongated silicon structures making trenches 67, 68, 69 into the single crystal silicon structures 53, 54 deeper than the sidewalls, extending below the lower boundary 70 of the sidewall blocking layer 65, and other sidewall structures as shown in the drawing. The sidewall blocking layers can comprise a material that acts to block silicide formation on the upper portions of the protruding elements, such as silicon oxide, silicon nitride, or another material chosen for compatibility with the silicide formation processes.

Figure 7A:
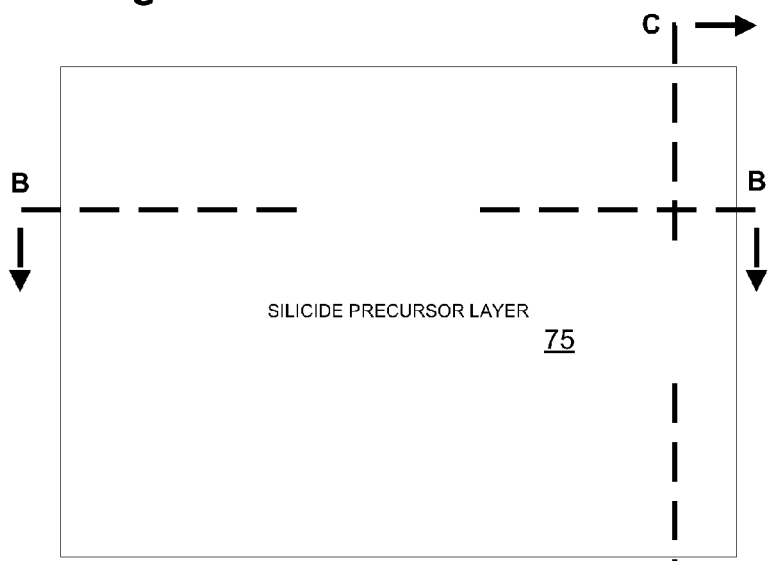
FIGS. 7A-7C are a plan view, a horizontal cross-section view and a vertical cross-section view, respectively, of a work piece during a next stage after silicide precursor deposition over the work piece in the first representative process.
Figure 7C:
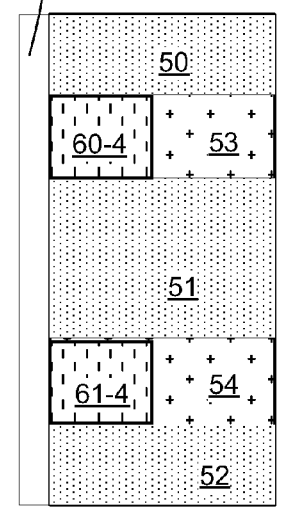
Figure 7B:
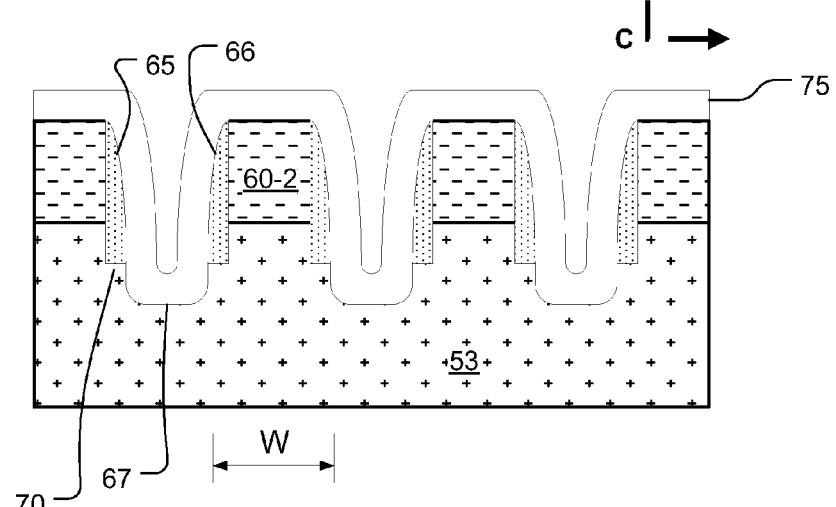

FIGS. 7A-7C are a plan view, a horizontal cross-section view and a vertical cross-section view, respectively, of a work piece during a next stage after deposition of a silicide precursor in a layer 75 over the work piece. The layer 75 of the silicide precursor is conformal with the trenches 67. The sidewall blocking layers 65, 66 separate the layer 75 from the protruding elements along a length that is deeper than the extent of the upper silicon nodes (e.g. 60-2). The thickness of layer 75 depends on the silicide formation dynamics with the underlying silicon body 53, and the width W along the horizontal dimension shown in FIG. 7B of the bases of the protruding elements below the sidewall blocking layers 65, 66. There should be sufficient silicide precursor in layer 75 to cause silicide formation through more than half the width W in the silicon body 53 so that silicide growth into the silicon body 53 on both sides of a protruding element connects beneath the single crystal protruding elements. The amount of silicide precursor and the maximum width W which can be implemented depend on the particular silicide chosen, and depth of growth of the silicide into the body. Thus, the silicide element 80 is a silicide conductor having first portions 80-1 on the top surface 53-t of the body between protruding single crystal silicon features in the plurality of single crystal silicon features, and second portions 80-2 abutting adjacent first portions 80-1, and extending through or beneath the protruding single crystal silicon features, whereby single crystal silicon nodes on protruding single crystal silicon features are separated from the single crystal silicon body by the silicide conductor.

As a basic reference, typical silicide growth has been characterized as forming silicide that is about 2.5 times thicker than the precursor, with growth into the underlying silicon being about 1.5 times the thickness of the precursor. So, if the width W is about 300 nanometers, the thickness of the precursor should be, with this basic reference, about 120 nanometers. With 120 nanometers of precursor, the silicide would grow into the body 53 about 180 nanometers. Thus, the silicide growth from both sides of the protruding elements will merge, with a margin of about 30 nanometers on a side.

FIGS. 8A-8C are a plan view, a horizontal cross-section view and a vertical cross-section view, respectively, of a work piece during a next stage after annealing to form silicide and cleaning the excess precursor material. The silicide precursor in layer 75 reacts with the single crystal silicon structures 53, 54 in the region below the sidewalls consuming the single crystal silicon until the silicide growth from opposing sides of the protruding structures merges to form a single silicide conductor 80, 82 along their respective elongated silicon structures 53, 54. As illustrated in FIG. 8B, this silicide growth from opposing sides of the elongated silicon structures 53, 54, results in the silicide conductor 80 separating single crystal silicon nodes 76-1 through 76-4 from underlying single crystal substrate 53. Thus, the single crystal silicon nodes 76-1 through 76-4 lie on an underlying silicide element 80, which can act as a conductor coupling the single crystal silicon nodes together, while preventing migration of carriers from the single crystal silicon nodes 76-1 to 76-4 into the bulk single crystal substrate 53. In the embodiment illustrated, the protruding elements are pillar-like, because of their formation on the elongated silicon bodies, and the resulting silicide element 80 is elongated to form a conductive line. In other embodiments, the protruding elements can be fence-like when formed on a silicon body without the shallow trench isolation features. In the fence-like embodiment, the resulting silicide element takes the form of a conductive plane, rather than a conductive line.

In the structure illustrated, the silicide also forms caps 81-1 through 81-4 and 83-1 through 83-4 on the second semiconductor nodes, providing a contact for coupling the resulting diode to other structures on the integrated circuit. In an alternative embodiment, the tops of the second semiconductor nodes 60-1 through 60-4 can be capped using silicon nitride or other material to protect it from the silicide process. In this way, different silicide could be used for the caps, or other structures can be implemented on top and in contact with the second semiconductor nodes 60-1 through 60-4.

FIG. 8B also illustrates one example structure for isolating the single crystal silicon element 53 from an underlying substrate. Specifically, assuming the single crystal element 53 has a p-type conductivity, is implemented within a deeper n-type well 85, which is in turn formed in a p-type bulk substrate 86. The n-well 85 can be patterned in a manner that isolates groups of elements or single elements, as suits a particular implementation. As mentioned above, in another alternative, the elongated single crystal silicon elements 53, 54 are formed on an underlying insulator such as a silicon dioxide layer, using silicon-on-insulator techniques or the like.

Figure 9:
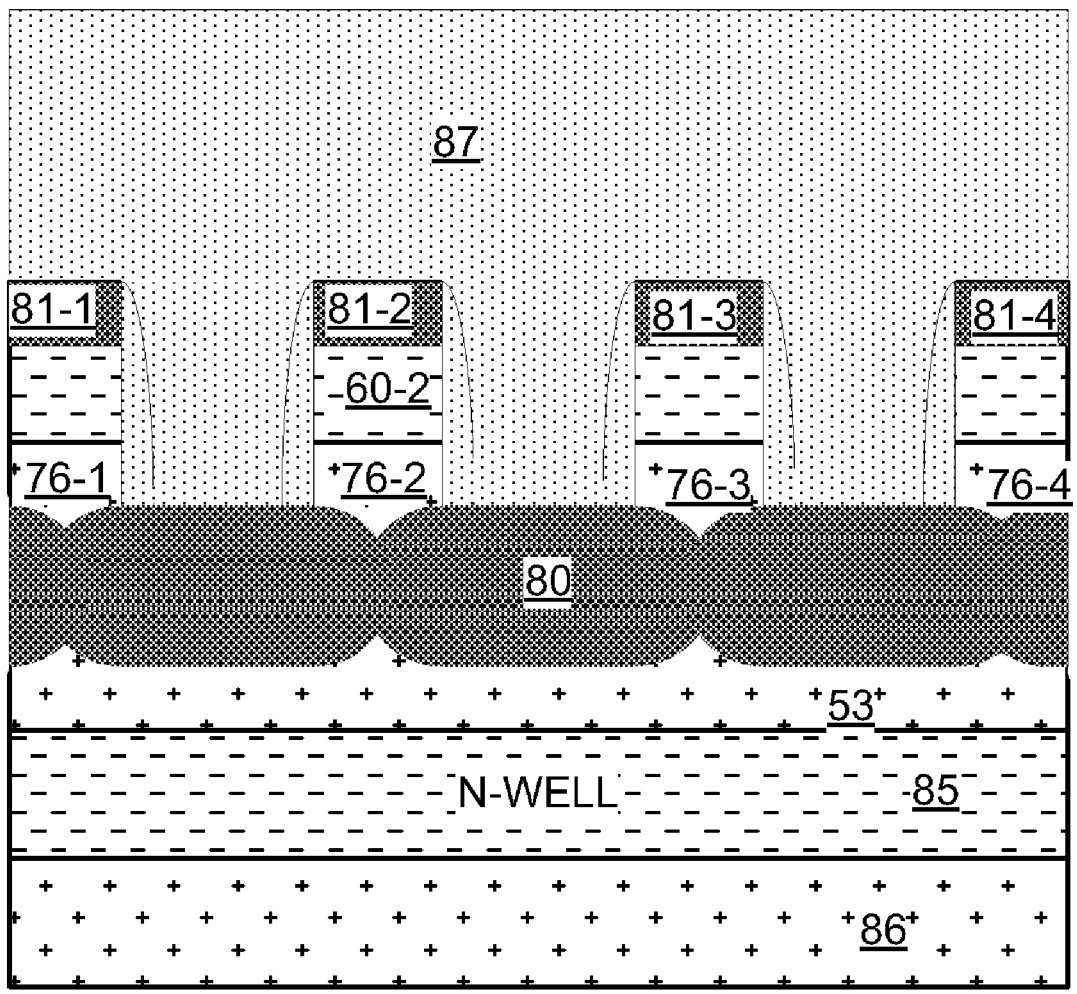
FIG. 9 is a horizontal cross-section view of a work piece during a next stage after depositing an interlayer dielectric fill on the work piece in the first representative process.

FIG. 9 is a horizontal cross-section view 13 of a work piece during a next stage after depositing an interlayer dielectric fill 87. The fill 87 can comprise one or more layers of silicon dioxide or other insulating materials such as boron-doped phospho-silicate glass (BPSG), phospho-silicate glass (PSG) and other common interlayer dielectric materials. The fill 87 serves to isolate the devices formed using the single crystal silicon nodes 76-1 through 76-4 on the silicide conductor 80. Additional integrated circuit manufacturing processes can be applied to couple the caps 81-1 through 81-4 to memory elements as shown in FIG. 2, or to overlying conductors and devices to complete an integrated circuit.

FIGS. 10A-10C are a plan view, a horizontal cross-section view and a vertical cross-section view, respectively, of a work piece during an alternative to the implant step of FIGS. 4A-4C where polysilicon nodes 100-1 through 100-3 and 101-1 through 101-3 are deposited and patterned over the elongated silicon structures 53, 54, and elongated silicon structures 53, 54 are etched to form protruding elements with trenches therebetween, as shown in FIG. 10B. The processes of FIGS. 5A-5C through FIG. 9 can be carried out without modification using this alternative technique.

Figure 11:
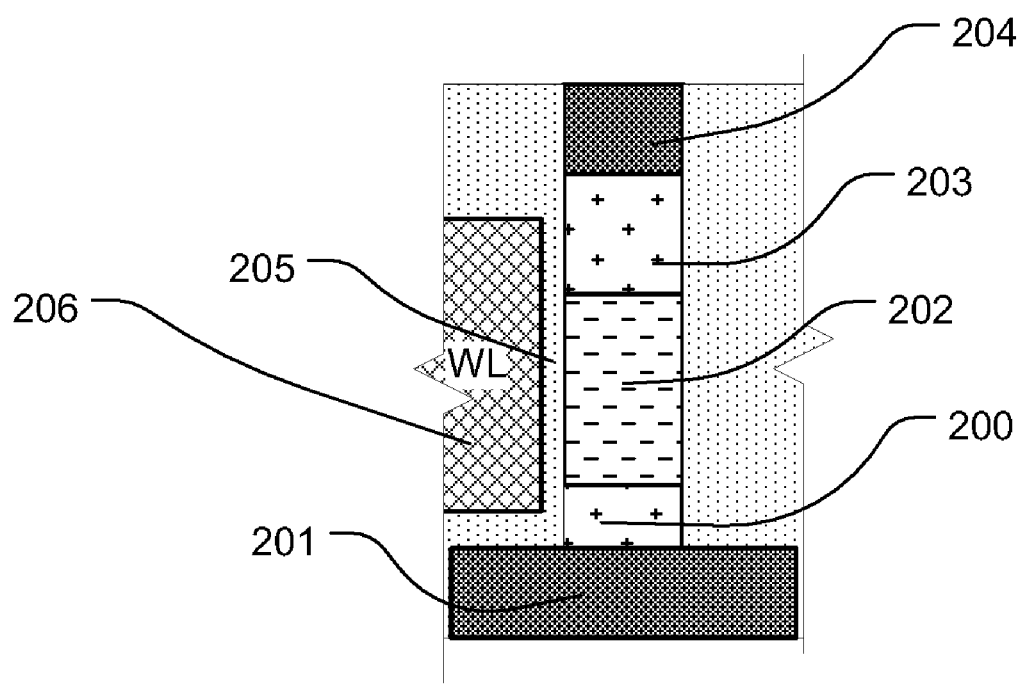
FIG. 11 shows a vertical field effect transistor including a single crystal silicon node over a silicide element, acting as one of a source and a drain.

FIG. 11 shows a vertical field effect transistor including a single crystal silicon node 200 acting as one of a source and a drain, over a silicide element 201. A second semiconductor node 202 is coupled with the single crystal silicon node 200, acting as a channel body, and an additional semiconductor node 203 is coupled with the second semiconductor node 202, acting as the other of the drain and source. A silicide cap 204 is formed on top of the additional semiconductor node 203. A gate dielectric 205 is formed adjacent the second semiconductor node 202 acting as the channel body for the transistor. A word line 206 is coupled to the second semiconductor node through the gate dielectric 205. A vertical transistor structure like that shown in FIG. 11 can be made using a process described in Risch, et al., "Recent Progress With Vertical Transistors", Proceedings of the 27th European Solid-State Device Research Conference, 22-24, Sep. 1997, pages 34-41, which modified as described above for forming a silicide structure beneath the node 200.

A structure including a single crystal silicon node on top of a silicide has been described, along with processes for making the structure, which are useful in formation of a variety of integrated circuit elements. Silicide beneath a single crystal silicon node can act to provide a conductive path on the integrated circuit among components, as an alternative to buried diffusion lines or other doped semiconductor components. Also, the silicide conductor prevents migration of carriers from the single crystal silicon node into a substrate or adjacent devices, which can activate parasitic devices in the integrated circuit. In addition, the manufacturing techniques described herein are compatible with the making of very small, dense integrated circuit components.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

We claim:

1. A device, comprising:
   a silicide element on a silicon substrate;
   a single crystal silicon node on the silicide element, the node being separated from the silicon substrate by the silicide element;
   a second semiconductor node, the single crystal silicon node and the second semiconductor node defining a pn-junction therebetween;
   an additional semiconductor node on the second semiconductor node, the single crystal silicon node, the second semiconductor node and the additional semiconductor node defining a transistor; and
   a silicide cap on the additional semiconductor node.

2. The device of claim 1, wherein the substrate comprises a single crystal silicon body.

3. The device of claim 1, further comprising a word line adjacent the second semiconductor node and acting as a gate of the transistor.

4. A device, comprising:
   a silicide element on a silicon substrate;
   a single crystal silicon node on the silicide element, the node being separated from the silicon substrate by the silicide element; and
   a second semiconductor node comprising single crystal silicon, the single crystal silicon node and the second semiconductor node defining a pn-junction there between.

5. A device, comprising:
   a silicide element on a silicon substrate;
   a single crystal silicon node on the silicide element, the node being separated from the silicon substrate by the silicide element; and
   a second semiconductor node comprising polycrystalline silicon, the single crystal silicon node and the second semiconductor node defining a pn-junction there between.

6. A device, comprising:
   a single crystal silicon body including a top surface and plurality of single crystal silicon features protruding from the top surface of the body;
   a silicide conductor having first portions on the top surface of the body between protruding single crystal silicon features in the plurality of single crystal silicon features, and second portions abutting adjacent first portions, and extending through the protruding single crystal silicon features, whereby single crystal silicon nodes on protruding single crystal silicon features are separated from the single crystal silicon body by the silicide conductor; and
   a plurality of second semiconductor nodes on corresponding single crystal silicon nodes, the single crystal silicon nodes and the second semiconductor nodes defining respective pn-junctions there between.

7. The device of claim 6, including a plurality of additional semiconductor nodes on the plurality of second semiconductor nodes, the single crystal silicon nodes, the second semiconductor nodes and the additional semiconductor nodes defining respective transistors.

8. The device of claim 7, including silicide caps on the plurality of additional semiconductor nodes.

9. The device of claim 7, further comprising word lines adjacent corresponding second semiconductor nodes in the plurality of second semiconductor nodes, the word lines acting as gates for the transistors.

10. The device of claim 6, wherein the second semiconductor nodes in the plurality of second semiconductor nodes comprise single crystal silicon.

11. The device of claim 6, wherein the second semiconductor nodes in the plurality of second semiconductor nodes comprise polycrystalline silicon.

12. The device of claim 6, including silicide caps on the plurality of second semiconductor nodes.

13. A method for manufacturing a device, comprising:
   forming a silicide element on a silicon substrate;
   forming a single crystal silicon node on the silicide element, the node being separated from the silicon substrate by the silicide element;
   forming a second semiconductor node, the single crystal silicon node and the second semiconductor node defining a pn-junction there between;
   forming an additional semiconductor node on the second semiconductor node, the single crystal silicon node, the second semiconductor node and the additional semiconductor node defining a transistor; and
   forming a silicide cap on the additional semiconductor node.

14. The method of claim 13, wherein the substrate comprises a single crystal silicon body.

15. A method for manufacturing a device, comprising:
forming a silicide element on a silicon substrate;
forming a single crystal silicon node on the silicide element, the node being separated from the silicon substrate by the silicide element; and
forming a second semiconductor node comprising single crystal silicon, the single crystal silicon node and the second semiconductor node defining a pn-junction there between.

16. A method for manufacturing a device, comprising:
forming a silicide element on a silicon substrate;
forming a single crystal silicon node on the silicide element, the node being separated from the silicon substrate by the silicide element; and
forming a second semiconductor node comprising polycrystalline silicon, the single crystal silicon node and the second semiconductor node defining a pn-junction there between.

* * * * *